(12) United States Patent
Vinson et al.

(10) Patent No.: US 7,326,032 B2
(45) Date of Patent: Feb. 5, 2008

(54) COOLING FAN WITH ADJUSTABLE TIP CLEARANCE

(75) Inventors: Wade D. Vinson, Magnolia, TX (US); John P. Franz, Houston, TX (US); Troy A. Della Fiora, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 192 days.

(21) Appl. No.: 11/263,131

(22) Filed: Oct. 31, 2005

(65) Prior Publication Data

US 2007/0098547 A1 May 3, 2007

(51) Int. Cl.
*F03B 11/00* (2006.01)
*F04D 29/08* (2006.01)

(52) U.S. Cl. .............. 415/173.1; 415/174.1; 416/133; 416/138; 416/150; 416/246

(58) Field of Classification Search .......... 415/173.1, 415/173.7, 174.1, 174.2; 416/133, 138, 149, 416/150, 205, 246
See application file for complete search history.

(56) References Cited

U.S. PATENT DOCUMENTS

| | | | |
|---|---|---|---|
| 4,931,904 A | 6/1990 | Yiu | |
| 5,927,944 A | 7/1999 | Belady | |
| 6,162,663 A | 12/2000 | Schoenstein et al. | |
| 6,219,242 B1 | 4/2001 | Martinez | |
| 6,508,621 B1 | 1/2003 | Zeighami et al. | |
| 6,517,315 B2 | 2/2003 | Belady | |
| 6,538,887 B2 | 3/2003 | Belady et al. | |
| 6,776,578 B2 | 8/2004 | Belady | |
| 6,972,956 B2 | 12/2005 | Franz et al. | |
| 7,056,204 B2 | 6/2006 | Vinson et al. | |
| 2003/0019646 A1 | 1/2003 | Clements et al. | |
| 2003/0235495 A1* | 12/2003 | Rivers | 415/173.3 |
| 2005/0184605 A1 | 8/2005 | Vinson et al. | |
| 2005/0233688 A1 | 10/2005 | Franz | |
| 2006/0012955 A1 | 1/2006 | Vinson et al. | |

FOREIGN PATENT DOCUMENTS

JP 59046316 A * 3/1984

* cited by examiner

*Primary Examiner*—Edward K. Look
*Assistant Examiner*—Dwayne J White

(57) ABSTRACT

A cooling fan comprising a fan housing and a plurality of blades rotatably disposed within a conduit through the fan housing. Each of the plurality of blades extends radially outward from a hub to a tip. The radial gap between the tips of the blades and the conduit defines a tip clearance. The cooling fan further comprises an tip clearance reduction system operable to control the tip clearance.

18 Claims, 5 Drawing Sheets

COOLING FAN WITH ADJUSTABLE TIP CLEARANCE

BACKGROUND

Computer systems include numerous electrical components that draw electrical current to perform their intended functions. For example, a computer's microprocessor or central processing unit ("CPU") requires electrical current to perform many functions such as controlling the overall operations of the computer system and performing various numerical calculations. Generally, any electrical device through which electrical current flows produces heat. The amount of heat any one device generates generally is a function of the amount of current flowing through the device.

Typically, an electrical device is designed to operate correctly within a predetermined temperature range. If the temperature exceeds the predetermined range (i.e., the device becomes too hot or too cold), the device may not function correctly, thereby potentially degrading the overall performance of the computer system. Thus, many computer systems include cooling systems to regulate the temperature of their electrical components. One type of cooling system is a forced air system that relies on one or more cooling fans to blow air over the electronic components in order to cool the components.

The cubic feet per minute ("CFM") of air that can be moved across an electric device is an important factor in how much heat can be removed from the device. Thus, the capacity of a cooling fan is a critical factor in selecting an air mover for use in a cooling application. The CFM that a cooling fan can produce is governed by a number of factors including: the total area of the blades generating the airflow, the free area provided for airflow through the fan, the design of the blades, and the power generated by the electric motor.

Axial flow fans generally comprise a plurality of radial blades rotating within a housing. Increasing performance demands on axial flow fans have required that fans provide increased volumes of air while, at the same time, reducing the size of the fan. One solution to increasing fan performance is simply to increase the speed at which the fan rotates. Increasing fan speed can also be accompanied by increased acoustic emissions, increased vibration, and decreased component life. Therefore, as can be appreciated, there remains a need in the art for cooling fans that provide high volumes of airflow by designs and improvements that increase performance without necessitating an increase in the speed at which fan operates.

BRIEF SUMMARY

A cooling fan comprising a fan housing and a plurality of blades rotatably disposed within a conduit through the fan housing. Each of the plurality of blades extends radially outward from a hub to a tip. The radial gap between the tips of the blades and the conduit defines a tip clearance. The cooling fan further comprises a tip clearance reduction system operable to control the tip clearance

BRIEF DESCRIPTION OF THE DRAWINGS

For a detailed description of exemplary embodiments of the invention, reference will now be made to the accompanying drawings in which.

NOTATION AND NOMENCLATURE

Figure 1:
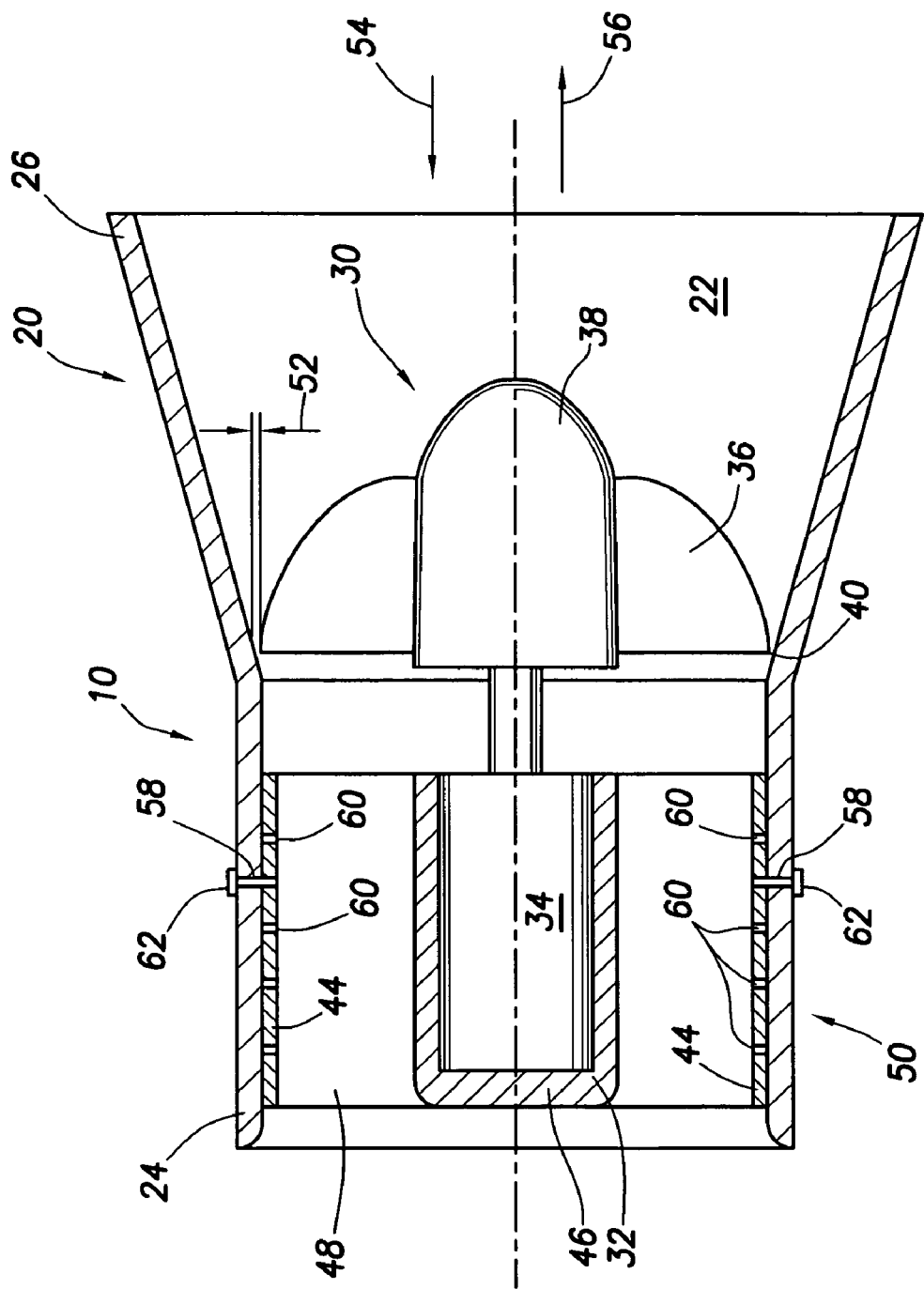
FIG. 1 shows a cross-sectional view of a cooling fan constructed in accordance with embodiments of the invention.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Axial fans utilize radial blades rotating within a housing. The gap between the tips of the blades and the housing, known as tip clearance, provides for tolerances in the manufacture of the components, assembly of the fan, and movement of the blades caused by vibration of the fan during operation. The tip clearance must be large enough to accommodate all of these without allowing contact between the blade tips and the housing. Large tip clearances can allow excessive air to bypass the blades, which decreases the efficiency of the fan. This bypassing air may also increase acoustic emissions and result in the fan producing an undesirable amount of noise.

Mass produced axial fans are often designed and constructed using techniques and processes that result in dimensional tolerances that can produce relatively large tip clearances between the outer tips of the radial blades and the inner surface of the housing. One way to minimize the tip clearance is to have an adjustable cooling fan assembly that allows the tip clearance to be adjusted during assembly. For a given fan total diameter, the mass production tolerances cause the fan blade diameter, which determines the total blade area doing the airflow work, to be smaller than the total fan diameter. Providing tip clearance adjustment during assembly allows for a larger fan blade diameter without changing fan total diameter. The fan work airflow (cubic feet per minute) is a cube of the fan blade diameter and the fan work back pressure (inches of water gauge) is a square of the blade diameter. Therefore, more airflow work can be produced without changing the fan total diameter. Providing tip clearance adjustment during assembly also helps avoid the use of higher cost manufacturing processes needed to produce high precision component parts. Thus, high-volume, low-cost parts and motors can be used to reduce tip clearance in order to produce more flow and less noise.

Figure 2:
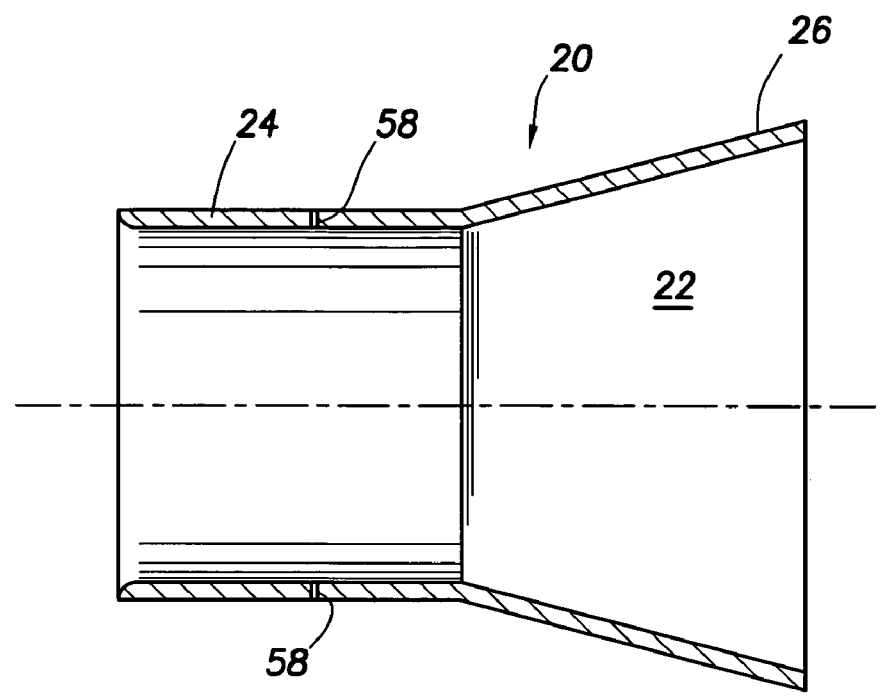
FIG. 2 shows a cross-sectional view of a cooling fan housing constructed in accordance with embodiments of the invention.
Figure 3:
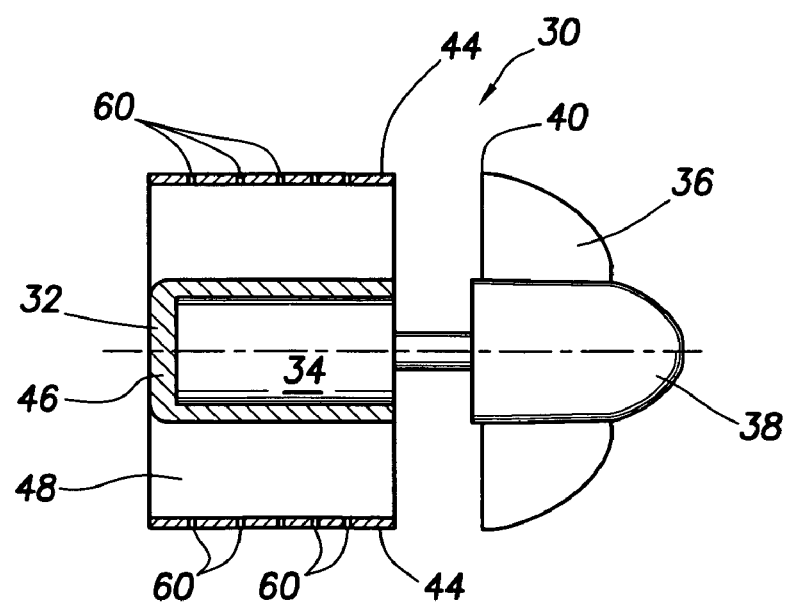
FIG. 3 shows a cross-sectional view of a cooling fan blade assembly, motor, and motor housing constructed in accordance with embodiments of the invention.

Referring now to FIG. 1, cooling fan assembly 10 comprises fan housing 20 and blade assembly 30. Fan housing 20 is shown in FIG. 2 and comprises conduit 22 comprising straight portion 24 and tapered portion 26. Blade assembly 30 is shown in FIG. 3 and comprises motor housing 32, motor 34, and blades 36. Blades 36 extend radially outward from hub 38 to blade tips 40. Motor housing 32 comprises outer ring 44, motor mount 46, and struts, or stators, 48. Adjustment mechanism 50 connects outer ring 44 to straight section 24 of conduit 22 allowing for adjustment of the axial position of blade assembly 30 relative to housing 20.

Referring back to FIG. 1, tip clearance 52 is defined as the radial gap between blade tips 40 and the wall of conduit 22. Blades 36, including blade tips 40, are disposed within tapered portion 26 of conduit 22. Therefore, as the axial position of blade assembly 30 changes relative to housing 20, tip clearance 52 changes. As blade assembly 30 moves in direction 54, tip clearance 52 decreases. As blade assembly 30 moves in direction 56, tip clearance 52 increases. Thus, tip clearance reduction system 50 allows for tip clearance 52 to be adjusted during assembly of fan 10.

Tip clearance reduction system 50 comprises fan housing mounting holes 58, blade assembly mounting holes 60, and connectors 62. Connectors 62 may be a pin, screw, dowel, or other connecting member. The spacing of mounting holes 58, 60 and the slope of tapered portion 26 of conduit 22 determine the amount of change in tip clearance 52 per adjustment interval. For example, mounting holes 58, 60 may be spaced at 0.1 inch intervals such that movement of one interval changes tip clearance 52 by 0.01 inch. As many mounting holes 58, 60 as necessary may be provided to accommodate variations in manufacture of the components.

Figure 4:
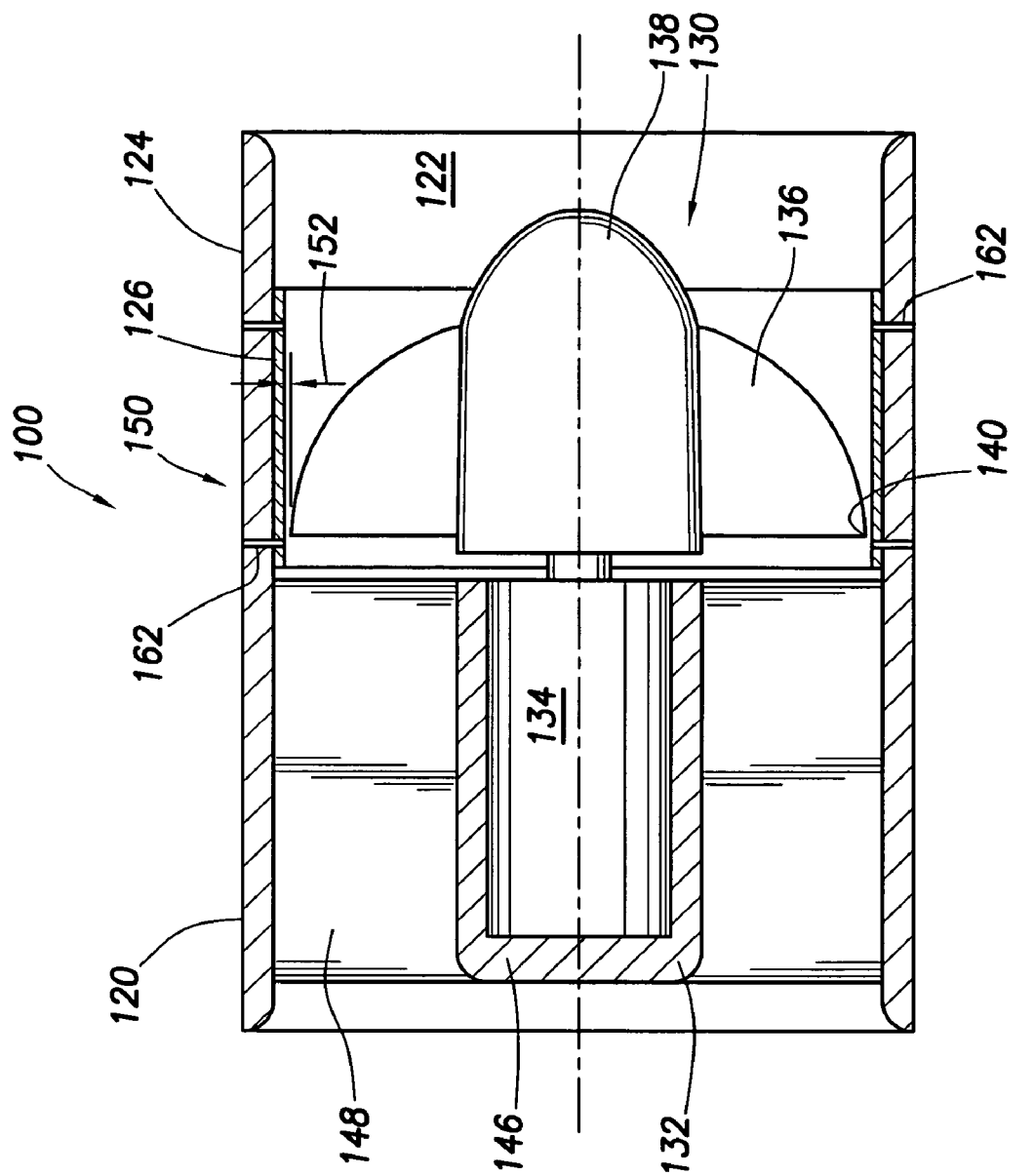
FIG. 4 shows a cross-sectional view of a cooling fan constructed in accordance with embodiments of the invention.

Referring now to FIG. 4, cooling fan assembly 100 comprises fan housing 120 and blade assembly 130. Fan housing 120 comprises conduit 122 comprising main body 124 and insert 126. Blade assembly 130 comprises motor housing 132, motor 134, and blades 136. Blades 136 extend radially outward from hub 138 to blade tips 140. Motor housing 132 comprises motor mount 146, and struts, or stators, 148.

Tip clearance reduction system 150 connects insert 126 to main body 124 of conduit 122. Insert 126 allows tip clearance 152 to be controlled by varying the thickness of the insert. Tolerances inherent to the construction of fan housing 120 and blade assembly 130 combine to make tip clearance 152 vary between individual assemblies. By providing inserts 126 having a variety of thicknesses, an insert with an optimum thickness can be selected so as to minimize tip clearance 152. Once an insert 126 is selected it is installed into main body 124 and fixed in place by connectors 162.

Figure 5:
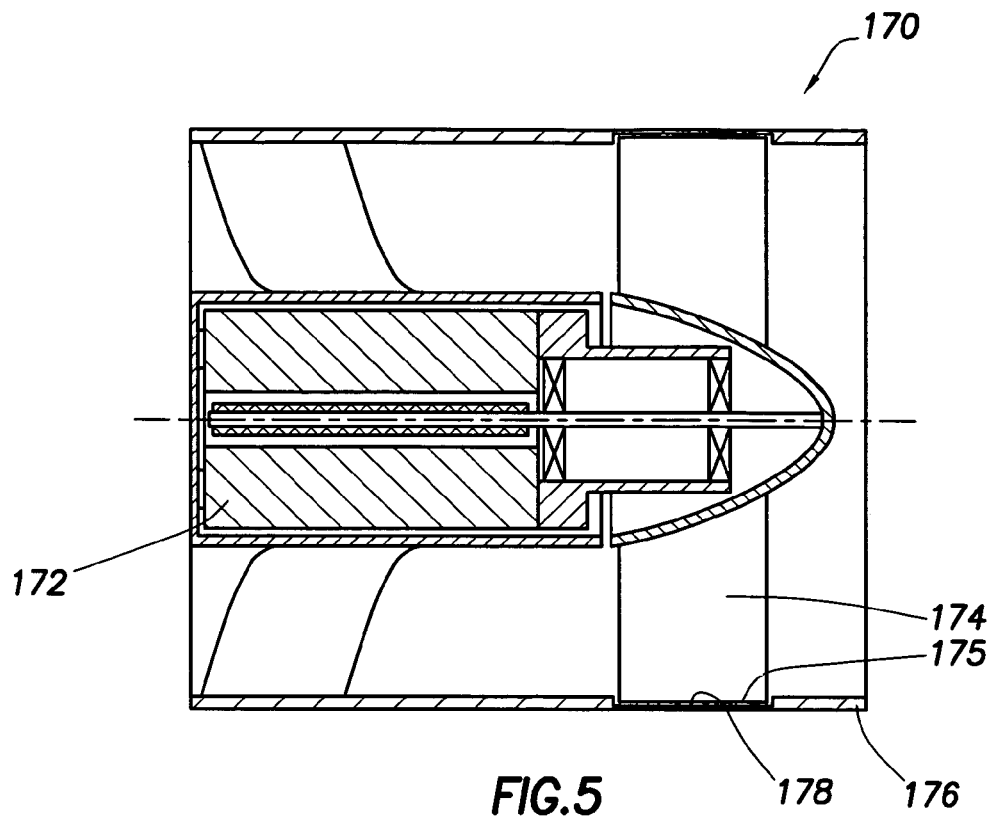
FIG. 5 shows a cross-sectional view of a cooling fan constructed in accordance with embodiments of the invention.

Referring now to FIG. 5, cooling fan assembly 170 comprises motor 172 and blade assembly 174 disposed within housing 176. Housing 176 comprises a tip clearance reduction system comprising recessed portion 178 that is aligned with blade tips 175 of blade assembly 174. Recessed portion 178 allows blade tips 175 to be removed from the normal flow path. Recessed portion 178 may be an integral part of housing 176 or may be a removable part that can be custom fit to the diameter of blade assembly 174. Removing blade tips 175 from the flow path reduces losses caused by vortices created at the tips and allows the effective blade area to cover the entire inner diameter of housing 176. In certain embodiments, blade tips 175 may be interconnected by a concentric ring (not shown).

Figure 6:
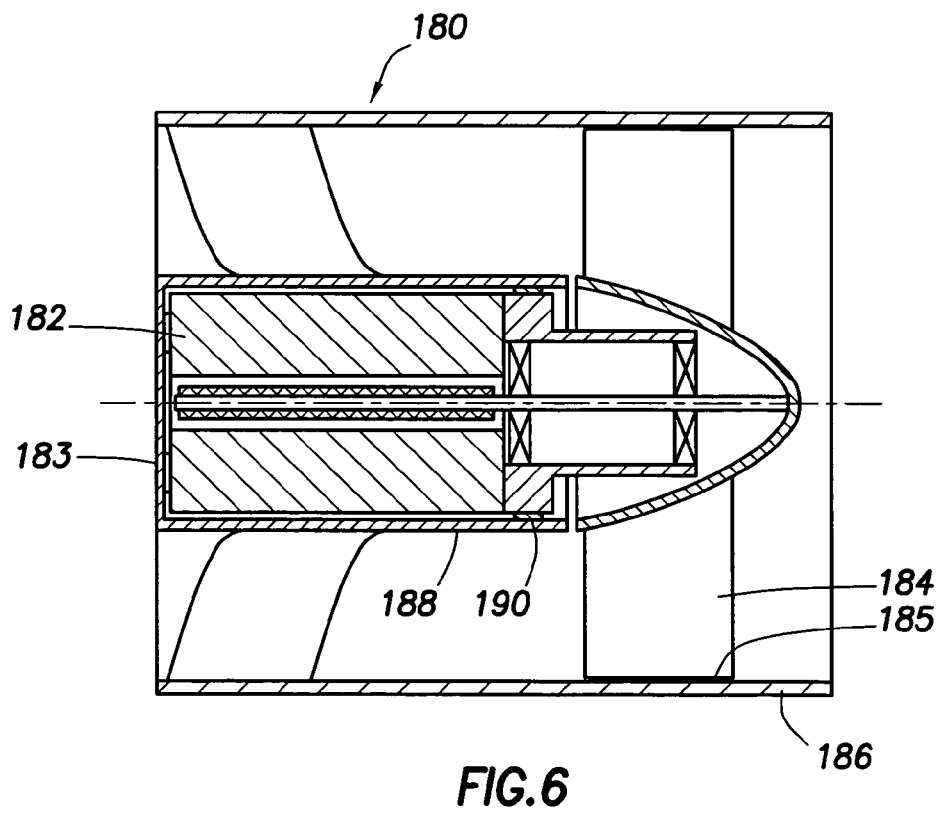
FIG. 6 shows a cross-sectional view of a cooling fan constructed in accordance with embodiments of the invention.

FIG. 6 illustrates cooling fan assembly 180 comprising motor 182, blade assembly 184 and housing 186. Motor 182 is cantilevered from base 183 of housing 186. With motor 182 being cantilevered from base 183, deflection of motor 182 can result in contact between blade tips 185 and housing 186. In order to minimize deflection, and therefore allow a tighter tip clearance, cooling fan assembly 180 further comprises a tip clearance reduction system comprising alignment ring 190 disposed between motor housing 188 and motor 182. Alignment ring 190 may be a continuous stamped ring with a plurality of spring tabs or fingers that are compressed between housing 188 and motor 182. Because alignment ring 190 allows the position of motor 182 to be easily controlled and predicted, the tip clearance between blade tips 185 and housing 186 can be reduced. Alignment ring 190 can be used in conjunction with any of the above described blade tip reduction or adjustment systems described above or can be independently incorporated into other fan designs.

In alternate embodiments, the adjustment mechanism may include mating threaded surfaces, glued surfaces, or other means for connecting an insert or a blade assembly to a housing. In other embodiments, the axial adjustment of the blades may be provided by other components in the blade assembly. For example, the axial position of the motor relative to the motor housing or the axial position of the fan blades relative to the motor may also be adjustable and provide adjustment of the tip clearance. In certain embodiments, the blades may be fitted with winglets that increase the blade diameter. The blade and/or the housing may also be abraded or honed during manufacturing to ensure a close fit between the components.

Figure 7:
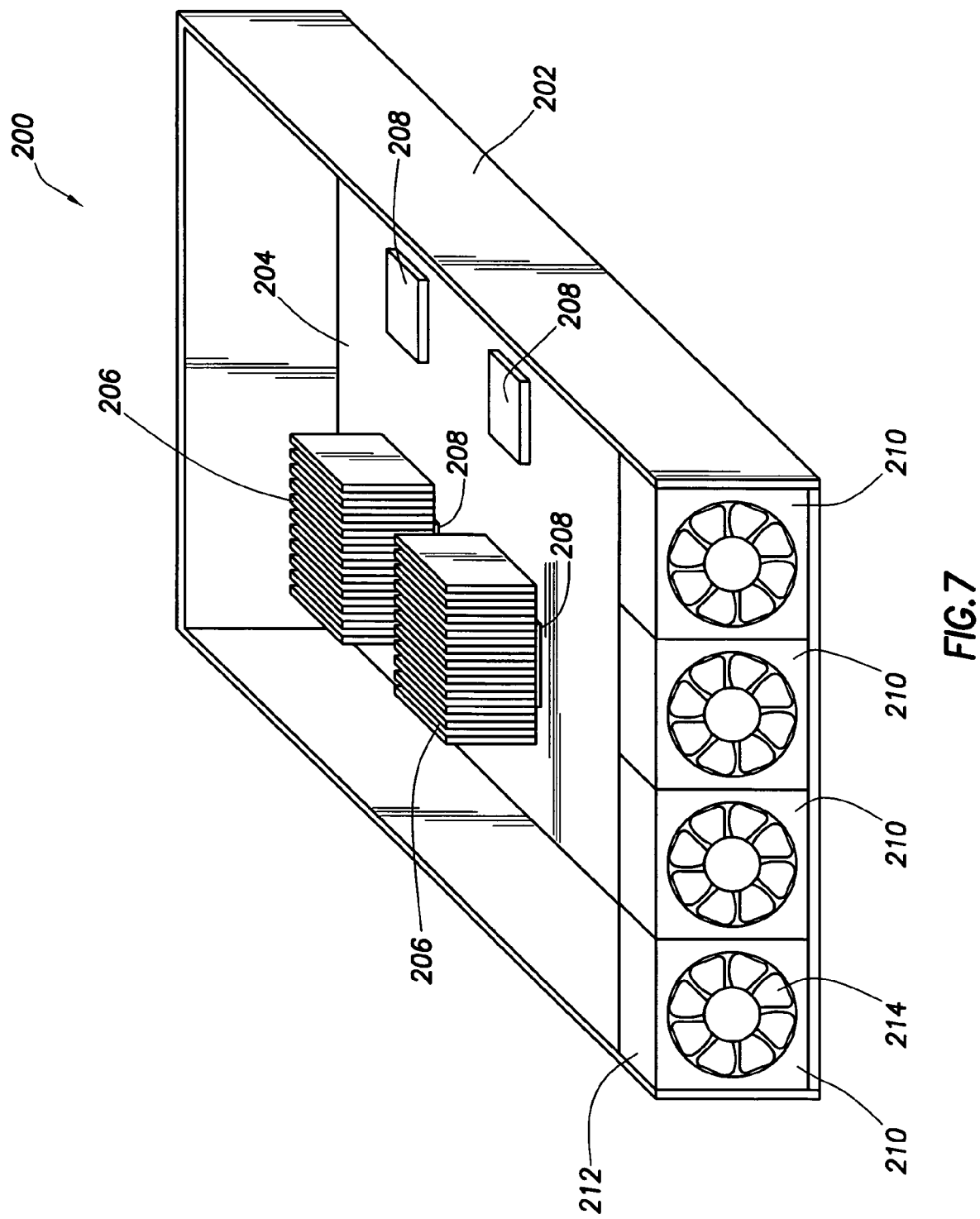
FIG. 7 shows a computer system including cooling fans constructed in accordance with embodiments of the invention.

Referring now to FIG. 7, a computer assembly 200 comprises chassis 202, motherboard 204, heat sinks 206, electronic components 208, and cooling fans 210. Each cooling fan 210 comprises a housing 212 surrounding a blade assembly 214, wherein each fan includes a tip clearance reduction system that allows control of the tip clearance between the blades and the housing. Cooling fans 210 are arranged so as to generate an airflow that cools electronic component 208. Heat sinks 206 may be arranged so as to be directly in the airflow generated by fans 210. Heat sinks 206 are coupled to electronic components so that the heat generated by the electronic component is dissipated to the airflow through the increased surface area of the heat sink.

The above discussion is meant to be illustrative of the principles and various embodiments of the present invention. Numerous variations and modifications will become apparent to those skilled in the art once the above disclosure is fully appreciated. For example, the tip clearance minimizing features described herein may be applied to other types of axial fans used to cool electronic components. It is intended that the following claims be interpreted to embrace all such variations and modifications.

What is claimed is:

1. A cooling fan comprising:
   a fan housing;
   a conduit through said fan housing;
   a plurality of blades rotatably disposed within said conduit, wherein each of said plurality of blades extends radially outward from a hub to a tip, wherein the radial gap between the tips of said blades and said conduit defines a tip clearance; and
   a tip clearance reduction system operable to control the tip clearance,
   wherein said tip clearance reduction system comprises a connector that allows said plurality of blades to be attached more than one position relative to said housing.

2. The cooling fan of claim 1 wherein said conduit further comprises a tapered section and a straight section.

3. The cooling fan of claim 2 wherein said plurality of blades is disposed within the tapered section and are axially translatable relative to said conduit.

4. The cooling fan of claim 1 further comprising:
   a motor housing coupled to said fan housing; and
   a motor coupled to said motor housing, wherein said motor rotatably supports said plurality of blades.

5. The cooling fan of claim 4 wherein said motor is at least partially disposed within a straight section of said conduit and is axially translatable relative to said fan housing.

6. The cooling fan of claim 1 wherein said tip clearance reduction system comprises an insert disposed between the tips of said blades and said conduit.

7. The cooling fan of claim 1 wherein said tip clearance reduction system comprises a recessed portion of said fan housing, wherein the tips of said blades are aligned with said recessed portion.

8. The cooling fan of claim 1 wherein said fan housing is mounted to a chassis supporting an electronic device.

9. A cooling fan comprising:
   a fan housing;
   a conduit through said fan housing;
   a plurality of blades rotatably disposed within said conduit, wherein each of said plurality of blades extends radially outward from a hub to a tip, wherein the radial gap between the tips of said blades and said conduit defines a tip clearance;
   a tip clearance reduction system operable to control the tip clearance;
   a motor housing coupled to said fan housing;
   a motor coupled to said motor housing, wherein said motor rotatably supports said plurality of blades; and
   wherein said tip clearance reduction system comprises an alignment ring disposed between said motor housing and said motor.

10. A cooling fan comprising:
    a fan housing;
    a conduit through said fan housing;
    a plurality of blades rotatably disposed within said conduit, wherein each of said plurality of blades extends radially outward from a hub to a tip, wherein the radial gap between the tips of said blades and said conduit defines a tip clearance; and
    means for reducing the tip clearance,
    wherein said fan housing is connected to a chassis supporting an electronic device.

11. The cooling fan claim 10 wherein said plurality of blades are disposed within a tapered section of said conduit and said means for adjusting the tip clearance comprises means for axially translating said plurality of blades relative to said fan housing.

12. The cooling fan of claim 11 further comprising a motor coupled to said fan housing and rotatably supporting said plurality of blades, wherein said means for reducing the tip clearance comprises means for axially translating said motor relative to said fan housing.

13. The cooling fan of claim 12 further comprising a motor housing coupled to said fan housing and supporting said motor, wherein said means for reducing the tip clearance comprises means for axially translating said motor housing relative to said fan housing.

14. The cooling fan of claim 10 wherein said means for reducing the tip clearance comprises means for connecting an insert between the tips of said blades and said fan housing.

15. A method for constructing a fan comprising:
    rotatably disposing a plurality of blades within a conduit through a fan housing, wherein each of the plurality of blades extends radially outward from a hub to a tip, wherein the radial gap between the tips of the blades and the conduit defines a tip clearance;
    utilizing a tip clearance reduction system to control the tip; and
    connecting the fan housing to an electronic device chassis.

16. The method of claim 15 wherein utilizing the tip clearance reduction system comprises axially translating the plurality of blades within a tapered section of the conduit.

17. The method of claim 15 wherein utilizing the tip clearance reduction system comprises installing an insert that surrounds the plurality of blades.

18. The method of claim 15 wherein utilizing the tip clearance reduction system comprises installing an alignment ring.

* * * * *

UNITED STATES PATENT AND TRADEMARK OFFICE
CERTIFICATE OF CORRECTION

PATENT NO. : 7,326,032 B2  Page 1 of 1
APPLICATION NO. : 11/263131
DATED : February 5, 2008
INVENTOR(S) : Wade D. Vinson et al.

It is certified that error appears in the above-identified patent and that said Letters Patent is hereby corrected as shown below:

On the title page item (57), under "Abstract", in column 2, line 6, after "comprises" delete "an" and insert -- a --, therefor.

In column 6, line 13, in Claim 11, after "fan" insert -- of --.

In column 6, line 40, in Claim 15, delete "tip;" and insert -- tip clearance; --, therefor.

Signed and Sealed this

Third Day of June, 2008

JON W. DUDAS
*Director of the United States Patent and Trademark Office*